(12) United States Patent
Minzoni et al.

(10) Patent No.: US 7,184,328 B2
(45) Date of Patent: Feb. 27, 2007

(54) DQS FOR DATA FROM A MEMORY ARRAY

(75) Inventors: Alessandro Minzoni, Morrisville, NC (US); Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 99 days.

(21) Appl. No.: 10/967,768

(22) Filed: Oct. 18, 2004

(65) Prior Publication Data
US 2006/0083082 A1    Apr. 20, 2006

(51) Int. Cl.
*G11C 7/00* (2006.01)
(52) U.S. Cl. .................. 365/193; 365/194; 365/189.05
(58) Field of Classification Search ................ 365/193, 365/194, 233, 236, 230.06, 189.05; 327/273, 327/277
See application file for complete search history.

(56) References Cited

U.S. PATENT DOCUMENTS

| 5,383,155 | A |   | 1/1995  | Ta |
| 5,436,865 | A |   | 7/1995  | Kitazawa |
| 5,502,681 | A |   | 3/1996  | Park |
| 5,550,784 | A | * | 8/1996  | Takai ......................... 365/233 |
| 5,802,002 | A |   | 9/1998  | Ienaga |
| 5,948,083 | A |   | 9/1999  | Gervasi |
| 6,664,838 | B1 | * | 12/2003 | Talledo ........................ 327/277 |
| 6,760,263 | B2 |   | 7/2004  | Liou |
| 6,856,558 | B1 | * | 2/2005  | Proebsting et al. ......... 365/193 |

FOREIGN PATENT DOCUMENTS

| EP | 0 624 878 A2 | 11/1994 |
| EP | 0 526 433 A3 | 2/1996 |

OTHER PUBLICATIONS

PCT Internation Search Report for International Application No. PCT/ep2005/010787 mailed on Feb. 24, 2006 (6 pgs.).

* cited by examiner

*Primary Examiner*—Gene N. Auduong
(74) *Attorney, Agent, or Firm*—Dicke, Billig & Czaja, PLLC

(57) ABSTRACT

A memory comprises a first circuit, a second circuit, and a latch. The first circuit is configured to provide a first signal indicating an earliest time valid data is available from a memory array in response to a read command. The second circuit is configured to provide a second signal indicating a latest time valid data is available from the memory array in response to the read command. The latch is configured to be connected to a data line coupled to the memory array in response to the first signal and disconnected from the data line in response to the second signal to latch data read from the memory array.

21 Claims, 3 Drawing Sheets

DQS FOR DATA FROM A MEMORY ARRAY

BACKGROUND

One type of memory known in the art is double data rate synchronous dynamic random access memory (DDR SDRAM). In general, DDR SDRAM includes at least one array of memory cells. The memory cells in the array of memory cells are arranged in rows and columns, with the rows extending along an x-direction and the columns extending along a y-direction. Conductive word lines extend across the array of memory cells along the x-direction and conductive bit lines extend across the array of memory cells along the y-direction. A memory cell is located at each cross point of a word line and a bit line. Memory cells are accessed using a row address and a column address.

DDR SDRAM uses a main clock signal and a data strobe signal (DQS) for addressing the array of memory cells and for executing commands within the memory. The clock signal is used as a reference for the timing of commands such as read and write operations, including address and control signals. DQS is used as a reference to latch input data into the memory and output data into an external device.

In a memory array, the read time required to output the data from the array varies from the first column of the array to the last column of the array. Typically, to compensate for this difference in read times, a read timer is used to estimate either the fastest or the slowest read time, usually the slowest read time. The read timer is then used to latch data read from the array between the estimated fastest and slowest read times. The read timer, however, provides only an approximation of the actual read times, which may vary based on the process, temperature, voltage, and other factors. In some cases, variations of these factors may result in the latching of invalid data from the array, especially as the frequency of the data access is increased.

SUMMARY

One embodiment of the present invention provides a memory. The memory comprises a first circuit, a second circuit, and a latch. The first circuit is configured to provide a first signal indicating an earliest time valid data is available from a memory array in response to a read command. The second circuit is configured to provide a second signal indicating a latest time valid data is available from the memory array in response to the read command. The latch is configured to be connected to a data line coupled to the memory array in response to the first signal and disconnected from the data line in response to the second signal to latch data read from the memory array.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
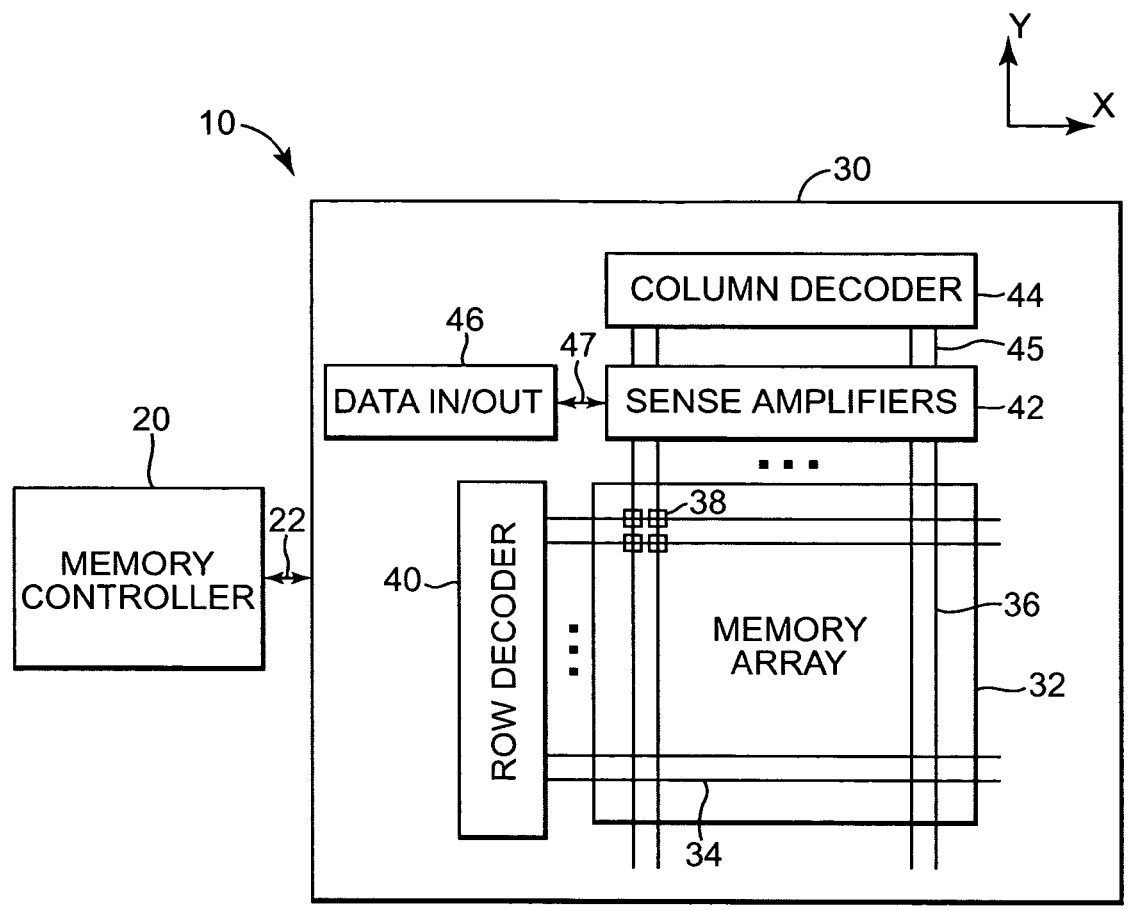
FIG. 1 is a block diagram illustrating one embodiment of a random access memory, according to the present invention.

FIG. 1 is a block diagram illustrating a random access memory 10. Random access memory 10 includes two dummy structures for generating a DQS early signal and a DQS late signal. The DQS early signal indicates the earliest time that valid data is available from the memory array during a read operation. The DQS late signal indicates the latest time that valid data is available from the memory array during a read operation. DQS early and DQS late are described in further detail later in this application. In one embodiment, random access memory 10 is a double data rate synchronous dynamic random access memory (DDR SDRAM). The DDR SDRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30, indicated at 22.

Conductive word lines 34, referred to as row select lines, extend in the x-direction across the array of memory cells 32. Conductive bit lines 36, referred to as column select lines, extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a read operation, memory controller 20 provides a column address strobe signal (CAS) to indicate when the memory cells are read by the sense amplifiers 42. The CAS signal, in addition to strobing the output from the sense amplifiers, is also used to initiate the output from two dummy structures. The first dummy structure provides the DQS early signal indicating the earliest time that valid data is available for latching from the array of memory cells 32.

The second dummy structure provides the DQS late signal indicating the latest time that valid data is available for latching from the array of memory cells 32.

The DQS early signal closes (connects) a latch in data in/out circuit 46 that enables the data read from the array of memory cells 32 to pass to the latch. The DQS late signal opens (disconnects) the latch in data in/out circuit 46 that latches the data read from the array of memory cells 32. The DQS early signal and the DQS late signal ensure that only valid data is latched in data in/out circuit 46. Only valid data will be latched in data in/out circuit 46 since no matter what part of the array of memory cells 32 the data is read from, the data will arrive at the latch between the DQS early signal and the DQS late signal.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
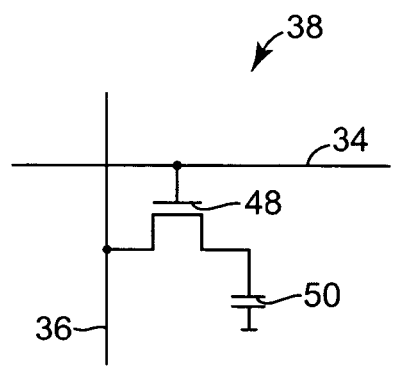
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic 0 or a logic 1. During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In DDR SDRAM, the read and write operations are synchronized to a system clock. The system clock is supplied by a host system that includes the DDR SDRAM 10. DDR SDRAM operates from a differential clock, CK and bCK. The crossing of CK going high and bCK going low is referred to as the positive edge of CK. Commands such as read and write operations, including address and control signals, are registered at the positive edge of CK. Operations are performed on both the rising and falling edges of the system clock.

The DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

Read and write accesses to the DDR SDRAM are burst oriented. Accesses start at a selected location and continue for a programmed number of locations in a programmed sequence. Accesses begin with the registration of an active command, which is followed by a read or write command. The address bits registered coincident with the active command are used to select the bank and row to be accessed. The address bits registered coincident with the read or write command are used to select the bank and the starting column location for the burst access.

The DDR SDRAM in the preceding description is referred to as DDR-I SDRAM for being the first generation of DDR SDRAM. The next generation of DDR SDRAM, DDR-II SDRAM has the same features as DDR-I SDRAM except that the data rate is doubled. The DDR-II SDRAM architecture is essentially a 4n prefetch architecture with an interface designed to transfer four data words per clock cycle at the DQs. A single read or write access for the DDR-II SDRAM effectively consists of a single 4n bit wide, one clock cycle data transfer at the internal memory array and four corresponding n bit wide, one quarter clock cycle data transfers at the DQs. In one embodiment, DDR SDRAM 10 is a DDR-II SDRAM.

Figure 3:
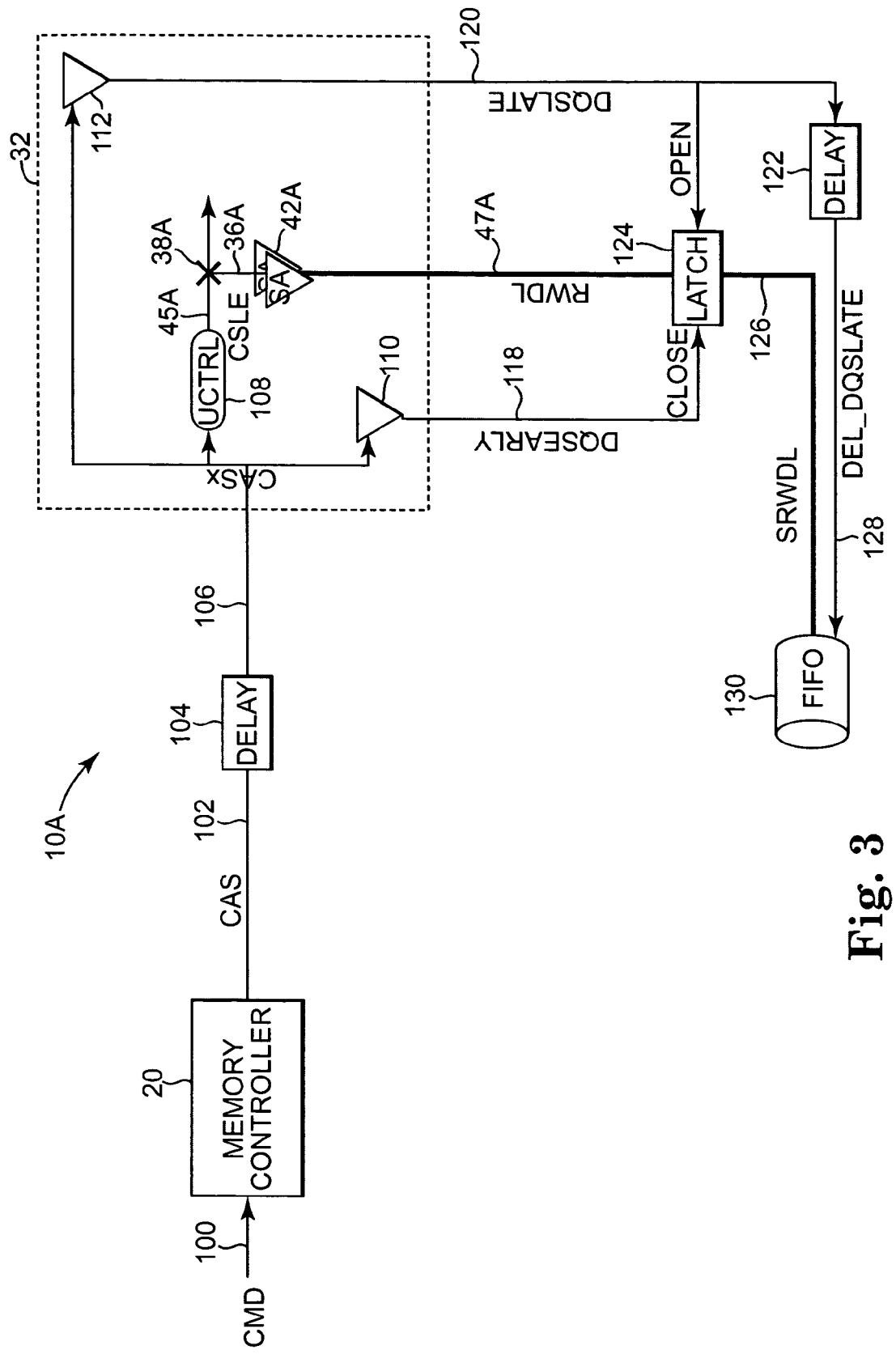
FIG. 3 is a diagram illustrating one embodiment of portions of the random access memory for latching data read from the memory array.

FIG. 3 is a diagram illustrating one embodiment of portions 10A of random access memory 10 for latching data read from memory array 32. Portion 10A of random access memory 10 includes memory controller 20, column address strobe (CAS) signal delay circuit 104, the array of memory cells 32, sense amplifiers 42A, DQS early circuit 110, DQS late circuit 112, DQS late signal delay circuit 122, latch 124, and first in first out (FIFO) 130. The array of memory cells 32 includes memory cells 38A.

Memory controller 20 is electrically coupled to a host device (not shown) through command (CMD) signal path 100 and to CAS signal delay circuit 104 through CAS signal path 102. CAS signal delay circuit 104 is electrically coupled to unit controller (UCTRL) 108, a plurality of other unit controllers (not shown) for the other columns in array 32, DQS early circuit 110, and DQS late circuit 112 through CASX signal path 106. Unit controller 108 is electrically coupled to memory cells 38A through column select enable (CSLE) path 45A. Memory cells 38A are electrically coupled to sense amplifiers 42A through bit lines 36A. In one embodiment, sense amplifiers 42A are a first set of sense amplifiers directly coupled to memory cells 38A. In another embodiment, sense amplifiers 42A are a second set of sense amplifiers indirectly coupled to memory cells 38A through the first set of sense amplifiers. Sense amplifiers 42A are electrically coupled to latch 124 through read/write data line (RWDL) 47A.

DQS early circuit 110 is electrically coupled to the close (connect) input of latch 124 through DQS early (DQSEARLY) signal path 118. DQS late circuit 112 is electrically coupled to the open (disconnect) input of latch 124 and DQS late signal delay circuit 122 through DQS late (DQSLATE) signal path 120. DQS late signal delay circuit 122 is electrically coupled to FIFO 130 through delayed DQS late (DEL_DQSLATE) signal path 128. Latch 124 is electrically coupled to FIFO 130 through spine read/write data line (SRWDL) 126.

In one embodiment, DQS early circuit 110 is located proximate the sense amplifier 42 that provides read data to latch 124 in the shortest time, and DQS late circuit 112 is located proximate the sense amplifier 42 that provides read data to latch 124 in the longest time. DQS early circuit 110 and DQS late circuit 112 are dummy structures similar in structure to sense amplifiers 42A, except that DQS early circuit 110 and DQS late circuit 112 each include a delay equal to the delay of unit controller 108 and output fixed values in response to the CASX signal rather than values sensed from a memory cell 38.

Unit controller 108 is selected by the column address of a read command to select memory cells 38A. In one embodiment, unit controller 108 is part of column decoder 44. Sense amplifiers 42A read the data from the selected memory cells 38A. Latch 124 latches the data passed from sense amplifiers 42A through RWDL data line 47A. In one embodiment, latch 124 is part of data in/out circuit 46. FIFO 130 latches the data passed from latch 124 through SRWDL data line 126 in response to the delayed DQS late signal from DQS late signal delay circuit 122. In one embodiment, FIFO 130 is part of data in/out circuit 46.

In operation, memory controller 20 receives a read command from a host on command signal path 100. Memory controller 20 selects the row (not shown) of the array of memory cells 32 based on the row address and the column(s) of the array of memory cells 32 based on the column address to activate unit controller 108. Memory controller 20 provides a CAS signal to CAS signal delay circuit 104 through CAS signal path 102. CAS signal delay circuit 104 delays the CAS signal and distributes the delayed CAS signal (CASX) through CASX signal path 106 to unit controller 108, DQS early circuit 110, and DQS late circuit 112. In response to the CASX signal, unit controller 108 provides the CSLE signal to memory cells 38A through CSLE signal path 45A. Sense amplifiers 42A sense the data stored in memory cells 38A and pass the sensed data to latch 124 through RWDL data line 47A.

In response to the CASX signal, DQS early circuit 110 provides the DQS early signal to the close (connect) input of latch 124 through DQS early signal path 118. The DQS early signal indicates the earliest time that data from the array of memory cells 32 is available on RWDL data line 47A. In response to the CASX signal, DQS late circuit 112 provides the DQS late signal to the open (disconnect) input of latch 124. The DQS late signal indicates the latest time that data from the array of memory cells 32 is available on RWDL data line 47A.

In response to the DQS early signal, latch 124 closes (connects) to allow the data on RWDL data line 47A to enter latch 124. In response to the DQS late signal, latch 124 opens (disconnects) from RWDL data line 47A to latch the data in latch 124. Therefore, latch 124 latches the data on RWDL data line 47A received between the DQS early signal and the DQS late signal. Latch 124 passes the latched data to FIFO 130 through SRWDL data line 126. DQS late circuit 112 also passes the DQS late signal to DQS late signal delay circuit 122. DQS late signal delay circuit 122 delays the DQS late signal and provides a delayed DQS late (DEL_DQSLATE) signal to FIFO 130 on DEL_DQSLATE signal path 128. In response to the DEL_DQSLATE signal, FIFO 130 latches the data from SRWDL data line 126. The data in FIFO 130 is then output to the DQs (not shown).

Figure 4:
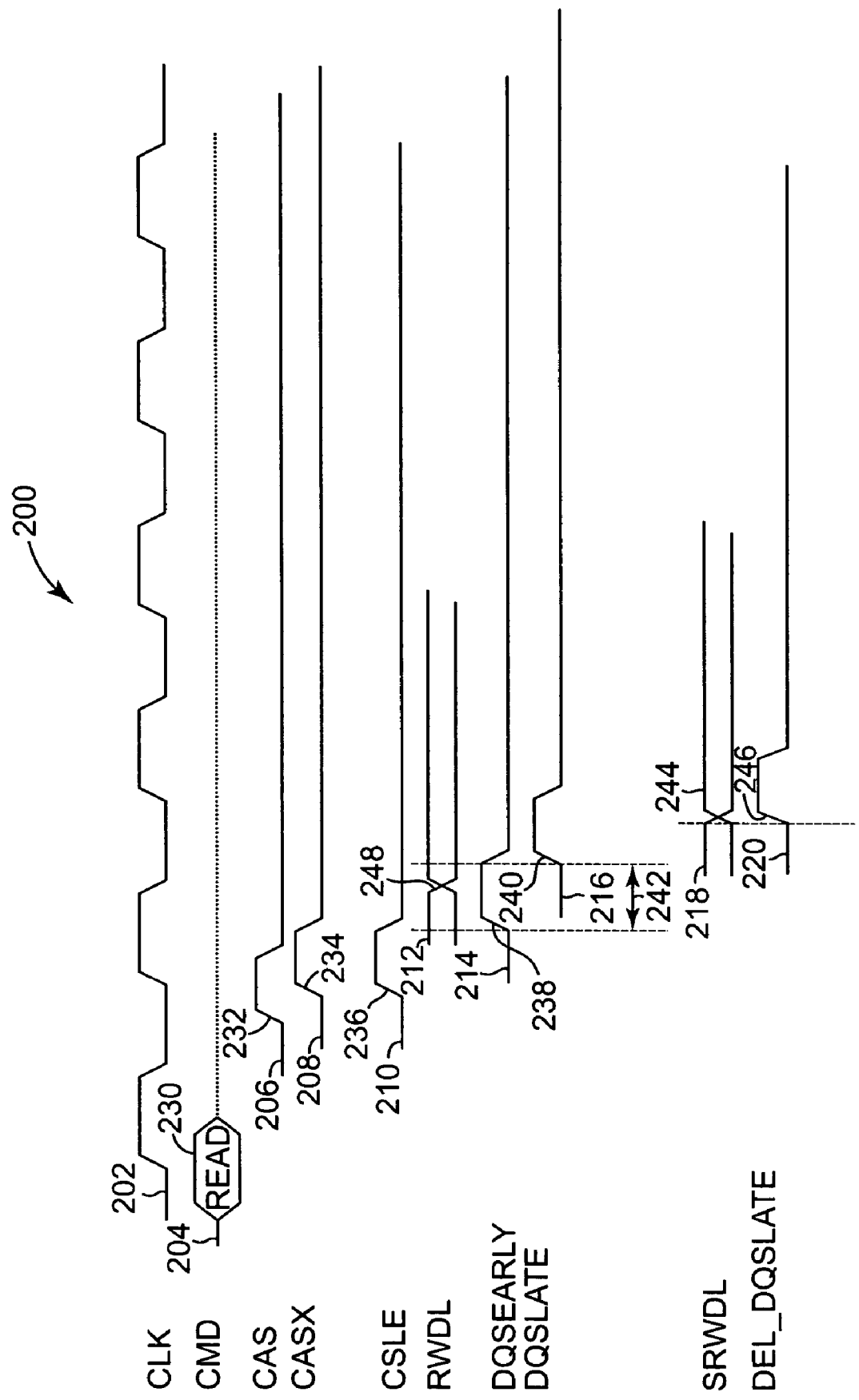
FIG. 4 is a timing diagram illustrating one embodiment of the timing of signals for reading data from the random access memory.

FIG. 4 is a timing diagram 200 illustrating one embodiment of the timing of signals for reading data from random access memory 10. Timing diagram 200 includes a clock signal 202, command signal 204 on command signal path 100, CAS signal 206 on CAS signal path 102, CASX signal 208 on CASX signal path 106, CSLE signal 210 on CSLE signal path 45A, RWDL signal 212 on RWDL data line 47A, DQS early signal 214 on DQS early signal path 118, DQS late signal 216 on DQS late signal path 120, SRWDL signal 218 on SRWDL data line 126, and delayed DQS late signal 220 on DEL_DQSLATE signal path 128.

All functions of memory 10 are timed to clock signal 202. With an addressed row of the array of memory cells 32 selected, a host device sends command signal 204, including a read command indicated at 230, to memory controller 20. Memory controller 20 receives the read command and in response selects the addressed column(s) of the array of memory cells 32. Once the column(s) of the array of memory cells 32 are selected, CAS signal 206 transitions to a logic high at 232. The logic high CAS signal 206 is delayed by CAS signal delay circuit 104, which transitions CASX signal 208 to a logic high at 234.

The logic high CASX signal 208 is received by unit controller 108, which transitions CSLE signal 210 to a logic high at 236. The logic high CASX signal 208 is also received by DQS early circuit 110 and DQS late circuit 112. In response to the logic high CASX signal 208, DQS early circuit 110 transitions DQS early signal 214 to a logic high at 238, and DQS late circuit 112 transitions DQS late signal 216 to a logic high at 240. The read data from the array of memory cells 32 on RWDL signal 212 arrives at 248 between the rising edge 238 of DQS early signal 214 and the rising edge 240 of DQS late signal 216, as indicated at 242. The DQS late signal is delayed by DQS late signal delay circuit 122, which transitions DEL_DQSLATE signal 220 to a logic high at 246. The data on SRWDL signal 218 passed from latch 124, as indicated at 244, is latched in FIFO 130 on the rising edge 246 of DEL_DQSLATE signal 220.

The read time required to output data from the array of memory cells 32 varies from the first column of the array to the last column of the array. To compensate for this difference in read times, typically a read timer is used to estimate either the fastest or the slowest read time. In the present invention, the read timer is replaced with DQS early circuit 110 and DQS late circuit 112, so that invalid data is not latched due to variations in the process, temperature, voltage, or other factors. In the present invention, variations of these factors do not result in the latching of invalid data from the array, even as the frequency of the data access is increased.

What is claimed is:

1. A memory comprising:
   a first circuit configured to provide a first signal indicating an earliest time valid data is available from a memory array in response to a read command;
   a second circuit configured to provide a second signal indicating a latest time valid data is available from the memory array in response to the read command; and
   a latch configured to be connected to a data line coupled to the memory array in response to the first signal and disconnected from the data line in response to the second signal to latch data read from the memory array.

2. The memory of claim 1, further comprising:
   a delay circuit configured to delay the second signal; and
   a FIFO configured to latch data passed from the latch in response to the delayed second signal.

3. The memory of claim 1, further comprising:. sense amplifiers configured to read data from memory cells in the memory array.

4. The memory of claim 3, wherein the first circuit and the second circuit comprise similar structures to the sense amplifiers.

5. The memory of claim 1, wherein the first circuit is located proximate a first sense amplifier providing a fastest read time from the memory array and the second circuit is located proximate a second sense amplifier providing a slowest read time from the memory array.

6. The memory of claim 1, wherein the first circuit is configured to provide the first signal in response to a CAS signal and the second circuit is configured to provide the second signal in response to the CAS signal.

7. The memory of claim 6, further comprising:
a memory controller configured to provide the CAS signal.

8. A memory comprising:
a memory array;
a DQS early circuit adapted to provide a first signal indicative of a fastest read time of the memory array;
a DQS late circuit adapted to provide a second signal indicative of a slowest read time of the memory array; and
a latch adapted to latch data output from the memory array, the latch adapted to close in response to the first signal and open in response to the second signal.

9. The memory of claim 8, further comprising:
a delay circuit for delaying the second signal; and
a FIFO adapted to latch data passed from the latch in response to the delayed second signal.

10. The memory of claim 8, wherein the DQS early circuit is proximate a first sense amplifier in a fastest read path in the memory array and the DQS late circuit is proximate a second sense amplifier in a slowest read path in the memory array.

11. The memory of claim 8, wherein the DQS early circuit is adapted to provide the first signal in response to a CAS signal, and wherein the DQS late circuit is adapted to provide the second signal in response to the CAS signal.

12. The memory of claim 8, wherein the memory comprises a dynamic random access memory.

13. The memory of claim 8, wherein the memory comprises a synchronous dynamic random access memory.

14. The memory of claim 8, wherein the memory comprises a double data rate synchronous dynamic random access memory.

15. The memory of claim 8, wherein the memory comprises a double data rate-fl synchronous dynamic random access memory.

16. A method of reading a memory, the method comprising:
providing a CAS signal to an array of memory cells;
generating a first signal indicating a fastest time valid data is available on a data line in response to the CAS signal;
closing a latch in response to the first signal to receive read data in the latch;
generating a second signal indicating a slowest time valid data is available on the data line in response to the CAS signal; and
opening the latch in response to the second signal to latch read data in the latch.

17. The method of claim 16, further comprising:
delaying the second signal; and
latching the read data from the latch in a FIFO in response to the delayed second signal.

18. A method of reading a memory, the method comprising:
receiving a read command including a column address;
selecting a column in the memory array based on the column address;
providing a CAS signal to the memory array;
providing a first signal indicating an earliest time valid data is output from the memory array in response to the CAS signal;
providing a second signal indicating a latest time valid data is output from the memory array in response to the CAS signal;
connecting a latch to a data line coupled to the memory array in response to the first signal;
receiving data in the latch from the selected row and column through the data line; and
disconnecting the latch from the data line in response to the second signal.

19. The method of claim 18, further comprising:
passing data from the latch to a FIFO.

20. The method of claim 19, further comprising:
delaying the second signal; and
latching data in the FIFO in response to the delayed second signal.

21. A synchronous dynamic random access memory comprising:
a memory array;
a DQS early circuit proximate a first sense amplifier in a fastest read path in the memory array, the DQS early circuit adapted to provide a first signal indicative of a fastest read time of the memory array;
a DQS late circuit proximate a second sense amplifier in a slowest read path in the memory array, the DQS late circuit adapted to provide a second signal indicative of a slowest read time of the memory array;
a latch adapted to latch data output from the memory array, the latch adapted to close in response to the first signal and open in response to the second signal;
a delay circuit for delaying the second signal; and
a FIFO adapted to latch data passed from the latch in response to the delayed second signal.

* * * * *